United States Patent [19]

Okumura et al.

[11] Patent Number: 5,015,330

[45] Date of Patent: May 14, 1991

[54] FILM FORMING METHOD AND FILM FORMING DEVICE

[75] Inventors: Katsuya Okumura; Takahiko Moriya; Shinji Miyazaki, all of Yokohama; Yoshio Kumagai, Kofu; Susumu Tanaka, Hachioji, all of Japan

[73] Assignees: Kabushiki Kaisha Toshiba, Kawasaki, Japan; Tokyo Electron Limited, Tokyo; Tokyo Electron Sagami Limited, Kanagawa, all of Japan

[21] Appl. No.: 486,416

[22] Filed: Feb. 28, 1990

[30] Foreign Application Priority Data

Feb. 28, 1989 [JP] Japan .................................. 1-46889
Jul. 10, 1989 [JP] Japan ................................. 1-177368

[51] Int. Cl.$^5$ ..................... B44C 1/22; H01L 21/306; C03C 15/00; B05D 3/06
[52] U.S. Cl. ........................................ 156/643; 134/1; 156/646; 156/657; 156/662; 156/345; 118/730; 118/620; 118/50.1; 204/192.37; 427/38; 427/309
[58] Field of Search ............... 156/643, 646, 657, 345, 156/662; 134/1, 31; 204/192.32, 192.37, 298; 427/38, 39, 307, 309; 118/729, 620, 50.1, 730

[56] References Cited

U.S. PATENT DOCUMENTS

| | | | |
|---|---|---|---|
| 4,065,369 | 12/1977 | Ogawa et al. | 204/164 |
| 4,192,706 | 3/1980 | Horiike | 156/643 |
| 4,668,337 | 5/1987 | Sekine et al. | 156/345 X |
| 4,786,352 | 11/1988 | Benzing | 134/1 X |
| 4,795,529 | 1/1989 | Kawasaki et al. | 427/38 X |
| 4,871,416 | 10/1989 | Fukuda | 134/1 X |
| 4,882,299 | 11/1989 | Freeman et al. | 156/345 X |

Primary Examiner—William A. Powell
Attorney, Agent, or Firm—Oblon, Spivak, McClelland, Maier & Neustadt

[57] ABSTRACT

A film forming method comprises the steps of placing a plurality of objects to be processed and supplying an etching gas in a reaction container, removing a natural oxidization originated film on an object to be processed placed in the reaction container under a heating condition by plasma etching, exhausting the etching gas after stopping supply of the etching gas so as to stop making of the plasma, and supplying a film forming gas in the reaction container without rendering the reaction container open to air so as to form a film on the objects.

6 Claims, 12 Drawing Sheets

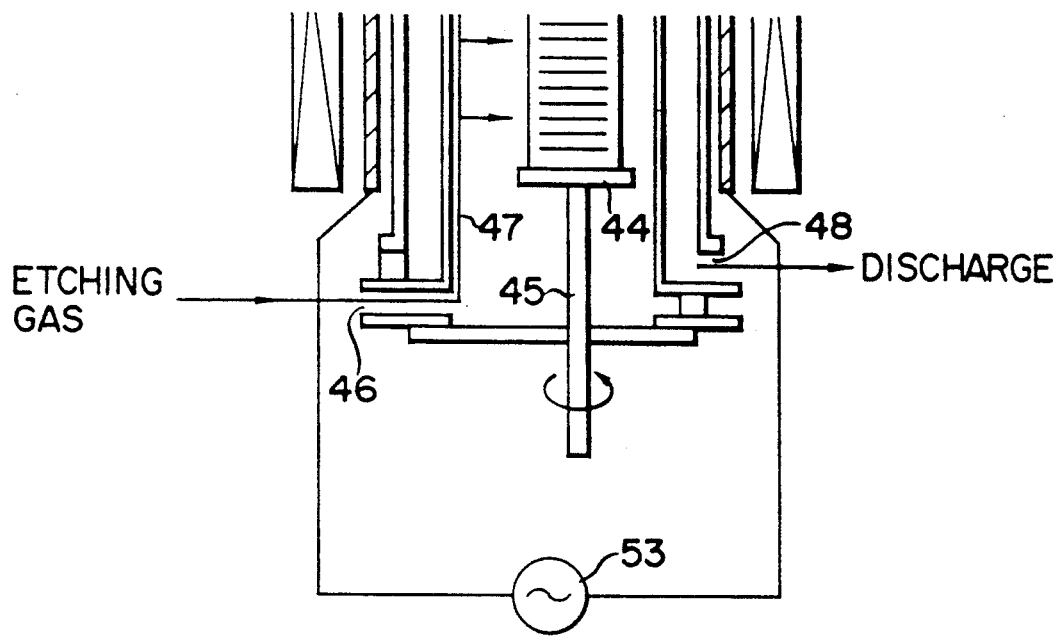
F I G. 4
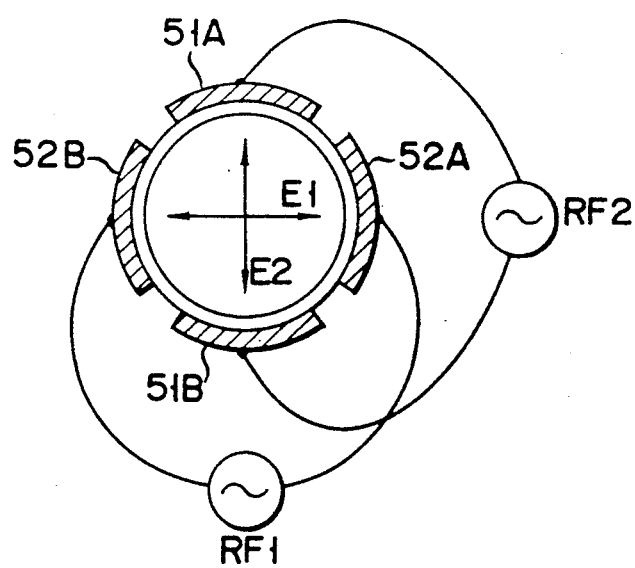
F I G. 5

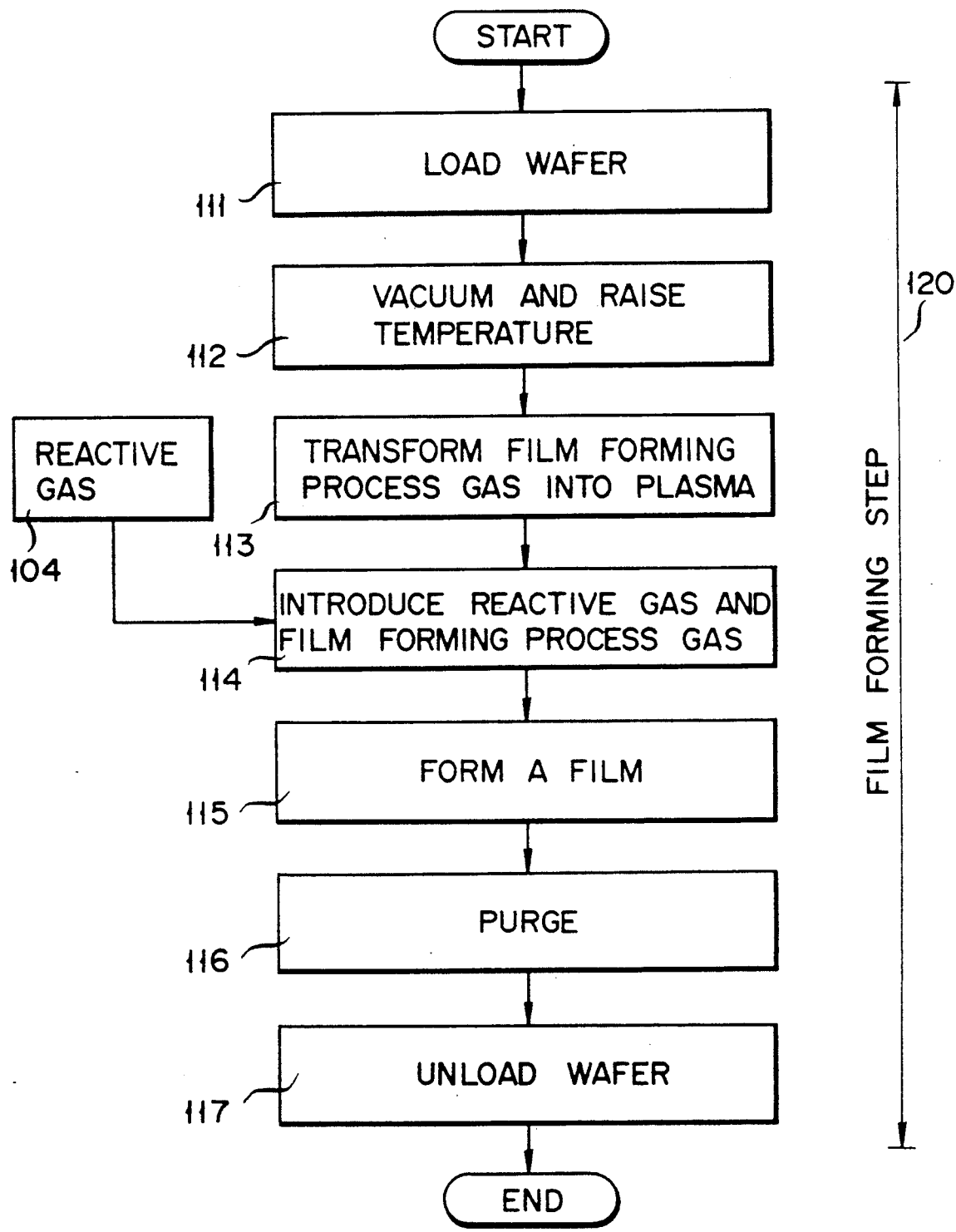
F I G. 9

FILM FORMING METHOD AND FILM FORMING DEVICE

BACKGROUND OF THE INVENTION

1. Field of the Invention

The present invention relates to a film forming method and a film forming apparatus suitable for forming a film through a thermal CVD (Chemical Vapor Deposition) process.

2. Description of the Related Art

In forming a wiring film such as a polysilicon (Poly-Si) film or a tungsten (W) film, on a semiconductor wafer (hereinafter simply referred to as wafer) through a thermal CVD process, remove of an $SiO_2$ film on the wafer surface is wanted in order to provide good electric contact between the polysilicon film and its base film.

For example, as shown in FIG. 13, an $SiO_2$ film 2 is formed on the surface of a P type silicon substrate 1. Then, a predetermined region of this $SiO_2$ film 2 is etched off. An $N^+$ region 3 is formed in that portion of the substrate 1 which lies directly under the etched region. Then, a polysilicon film 4 is formed on the $SiO_2$ film 2 through thermal CVD so as to cover the $N^+$ region.

In this case, exposing the substrate 1 to air prior to forming of the polysilicon film 4 forms an $SiO_2$ film 5 in the $N^+$ region through natural oxidization; this film 5 is an insulating film. If the polysilicon film 4 is formed under this condition, therefore, it is likely to provide poor electric contact between the polysilicon film 4 and the $N^+$ region 3 as the base film. Since the contact area between the polysilicon film 4 and the $N^+$ region 3 becomes relatively smaller with an increase in integration density of a semiconductor device, the problem of this proper electric connection at the contact portion becomes more significant.

Conventionally, the polysilicon film 4 is formed after removing the $SiO_2$ film 5 through wet cleaning using a cleaning solution.

The wet cleaning of the substrate, however, is very troublesome in views of manufacturing process and requires a significant amount of time and labors in fabrication of a semiconductor device.

In addition, inside a thermal CVD device is always heated at 600° to 800° C., so that when the substrate is put in the thermal CVD device, an oxidization film is formed about 10 to 30 Å thick on the surface of the substrate by natural oxidization with the irradiated heat and oxygen in the air. Even if the wet cleaning is performed in advance, therefore, when the substrate 1 is transferred in a reaction container of the thermal CVD device, an oxidization film 5 is again formed on the surface of the substrate 1 through natural oxidization. As a result, the $SiO_2$ film 5 originated from the natural oxidization cannot be completely removed. It is of course possible to prevent the $SiO_2$ film from being formed through natural oxidization at the time the substrate is inserted into the reaction container if the temperature of the thermal CVD device is reduced below 300° C. However, it takes a considerable time to increase or decrease the temperature of the thermal CVD device. In this respect, the alteration of the temperature of the thermal CVD device would certainly reduce the fabrication efficiency significantly.

To process a LCD (Liquid Crystal Device) substrate, a semiconductor substrate, or the like, there is a device which forms a passivation film such as an $SiO_3N_4$ film on a substrate wafer after Al wiring, for example. This type of film forming apparatus forms a film at as low a temperature as 400° C. or below, for example.

FIG. 14 illustrates a conventional plasma CVD device for forming such a passivation film. In a cylindrical reaction container 11 made of quartz are disposed a pair of comb shape high frequency electrodes 13 coupled to a high frequency power source 12, with their electrode plates 14 (comb portions) placed alternately. An object to be processed (hereinafter referred to as target object), such as a semiconductor wafer 15, is adhered to either side of each etching gas plate 14.

A gas inlet 17 for introducing a reactive gas 16 consisting of, for example, an $SiH_4+NH_3$ gas is provided at one end portion of the reaction container 11. A heater mechanism 18 is provided around the reaction container 11.

A passivation film is formed by such a plasma CVD device as follows. First, the processing temperature inside the reaction container is set to a predetermined level by the heater mechanism 18. Then, a predetermined reactive gas 16 is introduced through the gas inlet 17. A $Si_3N_4$ film is formed while transforming this reactive gas 16 into plasma between the high frequency electrode plates 14. At this time, the inside of the reaction container 11 is deaired through an air outlet provided at the reaction container by a vacuum mechanism 10 so as to provide a predetermined vacuum level in the reaction container 11.

According to this plasma CVD device, however, since a target object is located close to where plasma is generated, it is likely to be damaged by the generated plasma. In addition, a reaction-originated film adhered to each electrode plate 14 is separated by the plasma to be dust which is in turn undesirably adhered to the target object. Since the high frequency electrodes 13 themselves have a heat capacitance, it is not possible to quickly increase the temperature inside the reaction container 11 to a predetermined level. Further, the plasma CVD device has a poor response to temperature control, making it difficult to ensure a temperature control with a high accuracy.

As a solution to these problems, there has been proposed a so-called active gas transporting system which produces plasma outside the reaction container 11, then sends it inside this container 11 for the necessary treatment (refer to the Japanese Journal of Applied Physics, Vol. 117 (1978), Supplement 17-1, pp. 215-221). FIG. 15 illustrates a plasma CVD device utilizing this active gas transporting system. Disposed in a substantially spherical reaction container made of quartz is a heating table 23 on which a semiconductor wafer 22 as a target object is placed to be heated. A pair of process gas inlets 25 for introducing a process gas such as an $N_2$ or $O_2$ gas are provided at respective end portions of the reaction container 21. A reactive gas inlet 27 for introducing a reactive gas such as $SiH_4$ is provided at the upper portion of the reaction container 21, and an air outlet 29 is provided at the lower portion. This air outlet 29 is connected to a vacuum mechanism 29 for maintaining the inside of the reaction container 21 at a predetermined vacuum level.

Provided outside the reaction container 21 is a plasma generating mechanism 33 which comprises a plasma generating container 30 for introducing a process gas 24, a microwave guide 31 and a microwave output section 32.

According to thus constituted plasma processing device, a process gas such as an $N_2$ or $O_2$ gas transformed into plasma by the plasma generating mechanism 33 is introduced via a transport tube 34 in the reaction container 21 from the process gas inlet 25. A $Si_3N_4$ film is formed under the atmosphere of such a mixed gas at, for example, 400° C.

The prior art is intended to overcome the afore-mentioned problem of damaging a target object or generating dust by providing the plasma producing section outside the reaction container.

According to the conventional plasma processing device utilizing the active gas transporting system, however, since a target object is directly heated on the heating table, it cannot be uniformly heated. This is likely to provide an uneven treatment. Further, the reactive gas 26 and the process gas 24, introduced in the reaction container 21, are not uniformly mixed, which is likely to cause a variation in density distribution of these gases depending on which portion in the reaction container 21. This also stands in the way of providing an even treatment. These problems become more prominent as the size of the reaction container 21 increases. Further, a plurality of heating tables is necessary for treating a number of objects at the same time. This prevents enlarging of the reaction container 21 for processing a large quantity of target objects at a time, and thus makes the prior art disadvantageous for mass production.

SUMMARY OF THE INVENTION

Accordingly, it is an object of this invention to provide a film forming method for easily forming a good film without changing a heating condition.

It is another object of this invention to provide a film forming method and a film forming device, which prevents a target object from being damaged by plasma and ensures a uniform treatment and mass treatment of target objects.

According to one aspect of this invention, there is provided a film forming method comprising the steps of:

placing a plurality of objects to be processed in a reaction container;

supplying an etching gas in the reaction container;

making the etching gas in plasma;

removing a natural oxidization originated film on the objects to be processed under a heating condition by the plasma;

exhausting the etching gas after stopping supply of the etching gas so as to stop making of the plasma; and supplying a film forming gas in the reaction container without rendering the reaction container open to air so as to form a film on the objects.

According to another aspect of this invention, there is provided a film forming device for performing a predetermined treatment on a plurality of objects to be processed accommodated in a reaction container using a process gas and a reactive gas, the device comprising:

a plasma mechanism, provided outside the reaction container, for making the process gas into plasma; and a plasma transporting tube for guiding process-gas plasma provided by the plasma mechanism inside the reaction container in a direction parallel to respective surfaces of the objects on which a film is to be formed.

BRIEF DESCRIPTION OF THE DRAWINGS

FIG. 4 is a diagram illustrating a modification of part of the film forming device used in this invention;

FIGS. 5 and 6A to 6D are diagrams illustrating modifications of another part of the film forming device used in this invention;

FIG. 9 is a diagram for explaining how to form an $Si_3N_4$ film by the device shown in FIG. 8;

DETAILED DESCRIPTION OF THE PREFERRED EMBODIMENTS

Preferred embodiments of this invention will now be described referring to the accompanying drawings.

Figure 1:
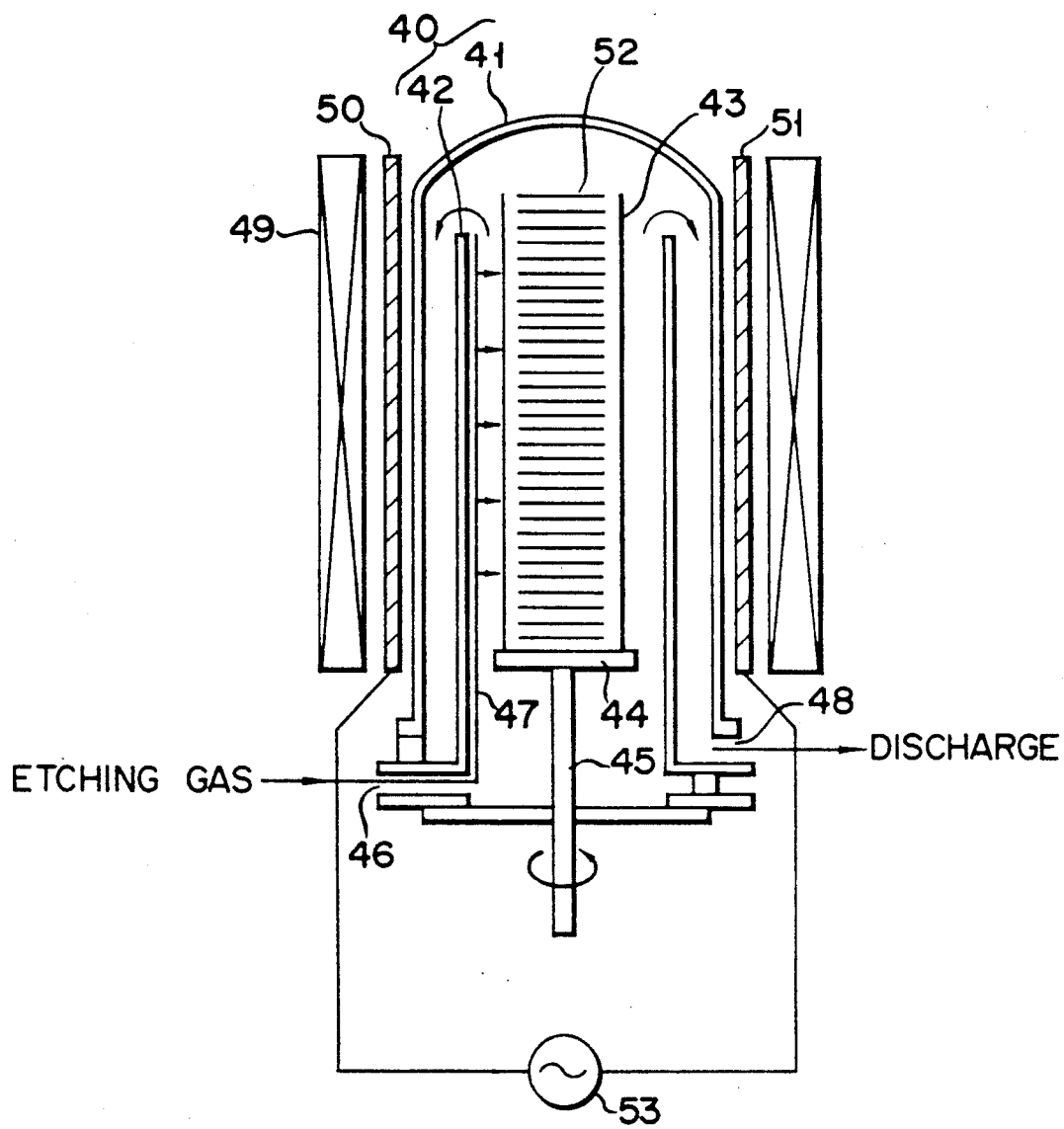
FIG. 1 is a diagram of a film forming device for explaining one embodiment of the present invention.

FIG. 1 illustrates one example of a thermal CVD device for use in a film forming method of this invention. This thermal CVD device constitutes a vertical reaction furnace. A reaction container 40 is constituted by a cylindrical reaction tube of quartz, and has a double tube structure comprising an outer quartz tube 41 and an inner quartz tube 42.

In the inner quartz tube 42 a wafer boat 43 having 100 to 150 semiconductor wafers (hereinafter referred to simply as wafers) 52 as target objects vertically arranged at predetermined intervals is disposed so that the wavers are subjected to a batch process. Wafers placed in wafer boat 43 are loaded by an elevator from the bottom of reaction container 40 and are unloaded after the treatment.

A rotary shaft 45 is vertically provided at the center of a boat support 44 for supporting the wafer boat 43. This rotary shaft 45 is driven by a motor (not shown). Rotation of the rotary shaft 45 rotates the overall boat support 44 in the arrowhead direction in the diagram. Consequently, the wafers 52 each rotate in a horizontal plane, so that etching is uniformly done on the surface of each wafer or a film is uniformly formed thereon.

An inlet 46 for supplying a reactive gas is provided at the side wall at the bottom of the reaction container 40. A reactive gas supplied through this inlet 16 is guided to a guide tube (injector) 47 made of quartz and having many perforations vertically formed therein. The reactive gas is ejected parallel to the surfaces of the wafers 52 stacked vertically, through the perforations bored in the guide tube 47, and is uniformly introduced onto the to-be-treated surfaces of the wafers 52. The introduced gas flows through a space between the inner quartz tube 42 and outer quartz tube 41 and is discharged outside from an air outlet 48 provided at the side wall at the bottom of the reaction container 40.

A heat resistance heater 49 formed in a coil shape in a hollow cylinder is provided around the reaction container 40 as an example of heating means, with a predetermined gap between the outer tube 41.

Figure 2:
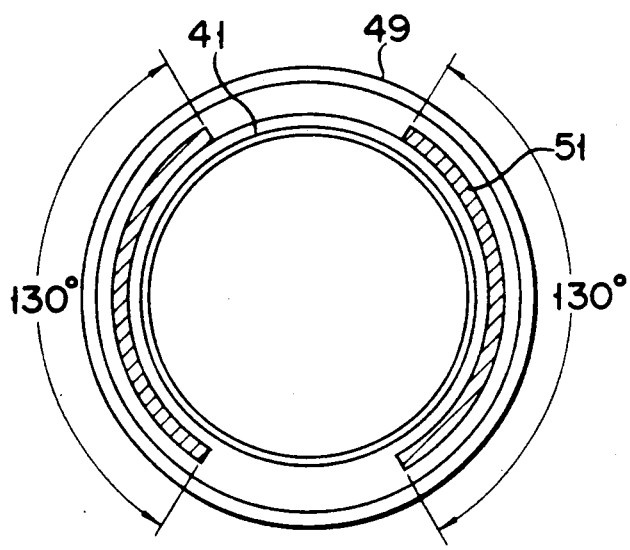
FIG. 2 is a plan view of the device shown in FIG. 1 as viewed from the above.

A pair of facing electrodes 50 and 51 are provided between the heater 49 and the outer tube 41. FIG. 2 illustrates how the electrodes 50 and 51 are arranged. The electrodes 50 and 51 each are made of a conductor having a curved surface suitable for the outer shape of the reaction container 40. The electrodes 50 and 51 are provided facing each other with the reaction container 40 in between. The electrodes 50 and 51 produces an effect of evenly heating the inside of the reaction container 40, and for this purpose, the electrodes are made of a nonmetallic material which has a conductivity and does not permit electric transmission to a heavy metal, such as Inconel (alloy of Ni based), or Na, K, Mg, Fe, Cu or Ni. Such a nonmetallic material may be silicon carbide, conductive ceramics or graphite. An etching gas $NF_3$ as a reactive gas in the reaction container 40 is transformed into plasma by supplying a high frequency signal voltage of, for example, 500 kHz from a high frequency signal generator 52. A film formed on each wafer 52 by natural oxidization is etched by the produced plasma. Etching gas such as $NF_3$ is made into plasma by supplying a high frequency signal to coils settled in stead of electrode 50, 51. In this case, an etching gas contained microwave is also used.

In a case where a pair of electrodes are provided outside the reaction container as illustrated, an electric field acting in the circumferential direction of the reaction container 40 becomes non-uniform depending on the angle at which the electrodes contact the outer quartz tube 41. It is confirmed that if the angle of curvature of the electrodes 50 and 51 is set within a range of 120 to 140 degrees, particularly at 130 degrees, good and uniform etching can be provided.

Figure 13:
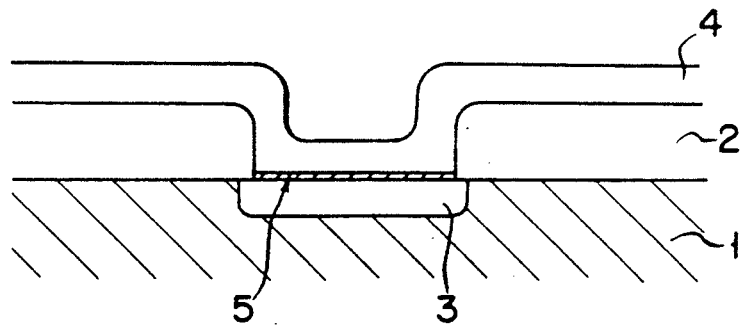
FIG. 13 is a diagram for explaining the problems of a conventional film forming method.
Figure 14:
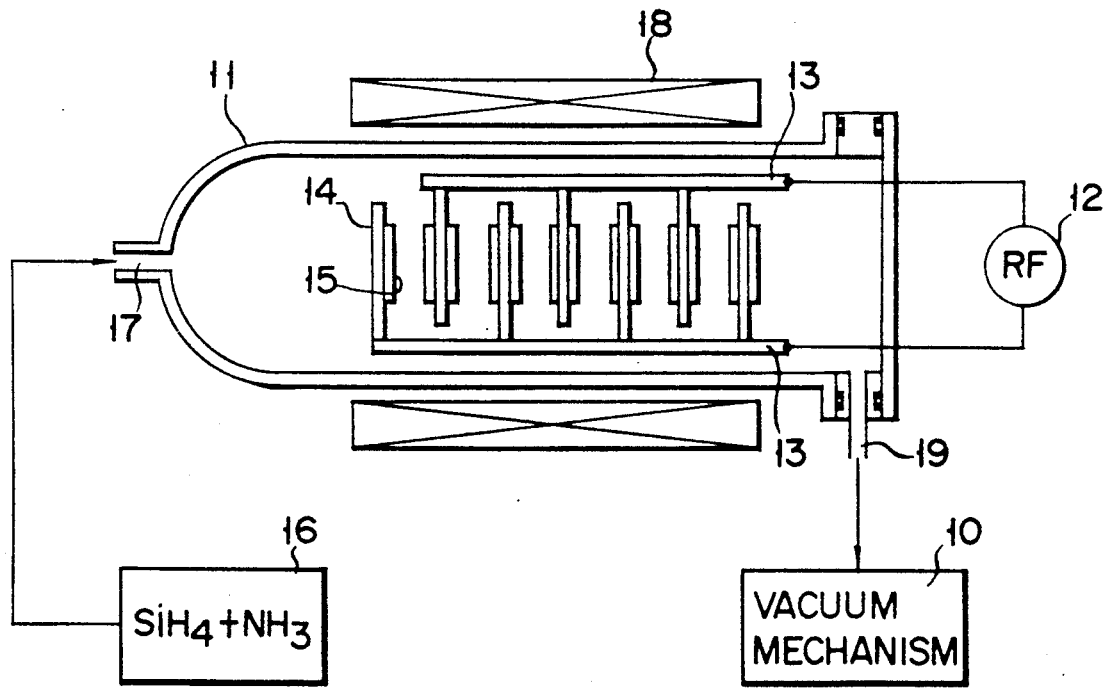
FIG. 14 is a diagram illustrating the structure of a conventional plasma processing device.
Figure 15:
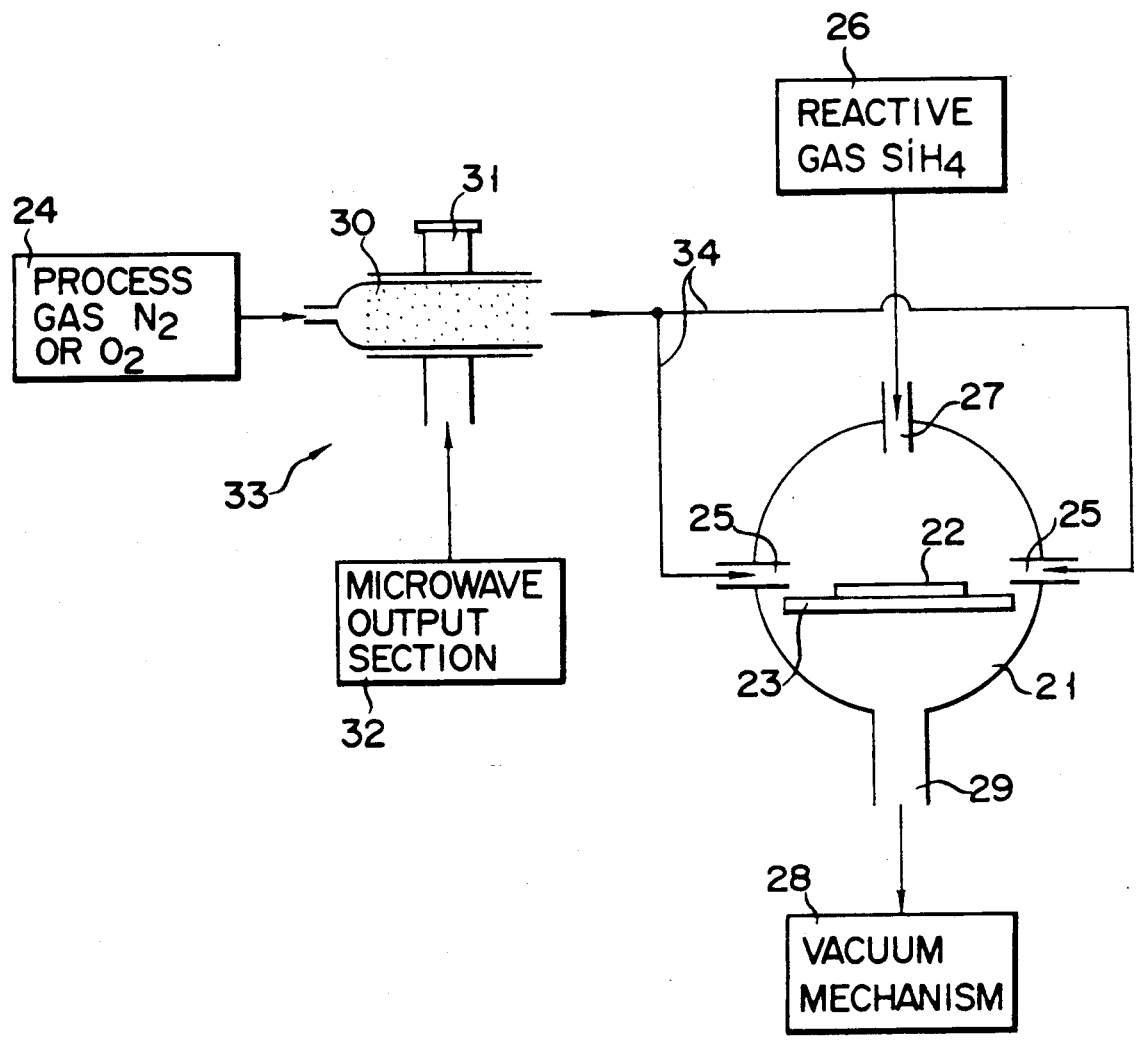
FIG. 15 is a diagram illustrating the structure of a plasma processing device utilizing an active gas transporting system.

The following will describe how to form a wiring film 4 of polysilicon or the like after removing a $SiO_2$ film 5 formed on the polysilicon film on the wafer surface by natural oxidization, as shown in FIG. 13, with reference to the following examples 1 and 2.

First Step

EXAMPLE 1

100 to 150 wafers 52 before formation of a wiring film are placed on the boat 43. At this time, the temperature in the furnace is set at 700° C. by the heater 49, and kept at this level in all the steps described below.

The inside of the reaction container 40 is deaired by a vacuum pump in this condition. $NF_3$ as an etching gas is supplied inside the reaction container 40 from the gas inlet 46, with its flow rate controlled to be 100 SCCM. In addition to the etching gas $NF_3$, hydrogen $H_2$ is supplied to the reaction container 40, with its flow rate controlled also to be 100 SCCM. At this time, the gas can be substantially uniformly supplied to many wafers 52 using the injector 47. The pressure inside the reaction container 40 is controlled to be 0.5 Torr.

A reason for adding the hydrogen gas is that since the $SiO_2$ film originated from natural oxidization is as thin as 20 to 30 Å, the F radical is reacted with $H_2$ to be reduced in the form of HF and thus to reduce the etching speed to 10 to 30 Å/min. Lowering the etching speed facilitates controlling of a control time and improves the evenness of etching in and between the surfaces of the wafers 52.

Figure 3:
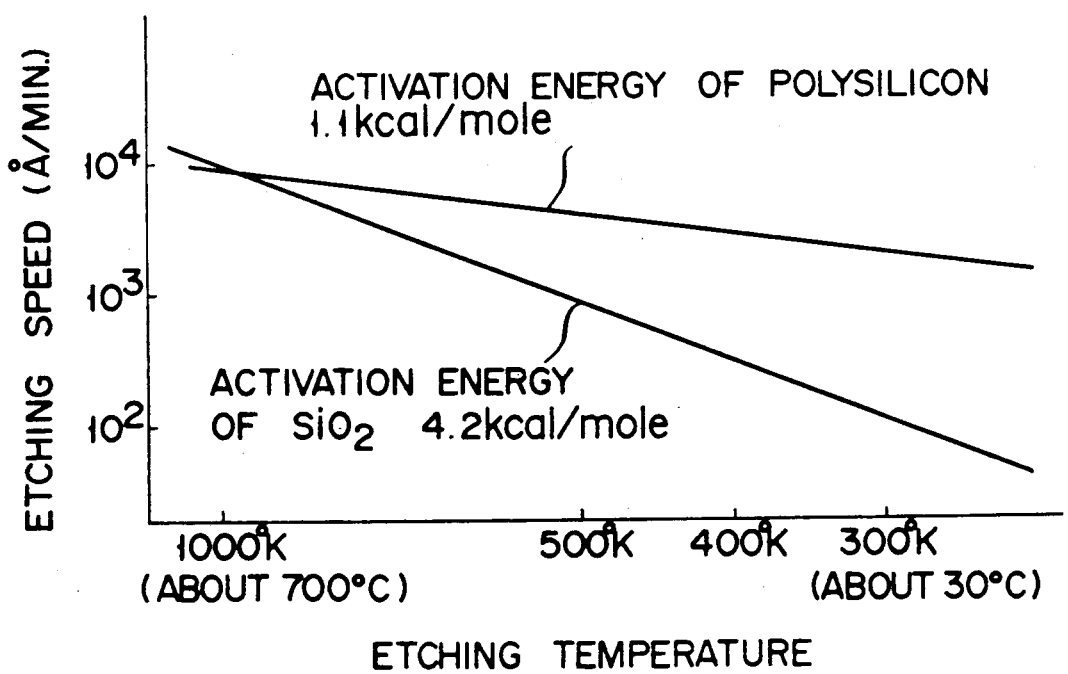
FIG. 3 is a diagram for explaining the principle of removing a natural oxidization film according to this invention.

Under this condition, a high frequency signal of 500 kHz and 200 W (output power) is supplied through an impedance matching unit (not shown) between the electrode pair 50 and 51 for a given period of time from the high frequency signal generator 52. As a result, the etching gas $NF_3$ is transformed into plasma. Then, the Si film and $SiO_2$ film are etched at substantially the same etching speed, as shown in FIG. 3. This prevents the $N^+$ region 3 from being etched much at the time of over-etching. Further, the natural oxidization originated film 5 as thin as 20 to 30 Å can be almost completely removed.

With the use of the etching gas $NF_3$ alone and without any additional gas, the natural oxidization originated $SiO_2$ film can be removed. In this case, the etching speed is several hundreds Å/min and the evenness of the etching is worse than the one in the above case.

The use of the injector 47 for supplying a gas and rotating the rotary shaft 45 to rotate the wafers 52 further improves the uniform etching in and between the surfaces of the wafers 52. That is, the injector 47 can inject the ga almost uniformly between the wafers 52 arranged vertically. This eliminates the unevenness of the gas density caused by the difference in vertical positions of the wafers 52, and thus improves the uniform etching between the surfaces of the wafers 52. Although plasma is not evenly produced in the reaction container 40, rotating the wafers 52 prevents any point on the surface of each wafer from being fixed at a specific location in the container and allows that point to undergo different atmosphere at various points. This can improve the evenness of etching in the surface of each wafer.

The generation of the plasma is considered to be concentrated at the proximity of the electrodes. In this respect, the position of the boat 43 in the reaction container 40 is set to be deviated from the center of the inner tube 42 of the reaction container 40, as shown in FIG. 4. And, at the deviated position in the reaction container 40, the boat 43 is rotated around the rotary shaft 45. Accordingly, the wafers 52 rotate at the proximity of where the intensity of the generated plasma is high, thus improving the evenness of etching in the surface of each wafer 52.

The unevenness of plasma resulting from the unevenness of an electric field generated in the reaction container by the high frequency signal supplied between the electrodes 50 and 51 can be reduced in the following manner. A high frequency signal is applied between the electrodes 50 and 51 in burst form in a period of, for example, 0.1 to 0.5 sec. That is, after the etching gas flows between the wafers 52, a high frequency signal is applied to the electrodes 50 and 51 for 0.1 sec, for example, to remove the natural oxidization film. After this specified period of time, the supply of the high frequency signal to the electrodes 50 and 51 is stopped. Upon elapse of a sufficient time for the etching gas to flow, e.g., 0.1 sec, the high frequency signal is again applied to the electrodes 50 and 51. The above steps are continuously repeated. In this manner, the electric field in the reaction container does not become non-uniform during a time in which the high frequency signal is not applied. Accordingly, the plasma is evenly distributed in the reaction container, thus ensuring uniform etching.

It should be noted that the etching gas is not restricted to $NF_3$, but may be $CF_4+O_2$ or other type as well.

EXAMPLE 2

This example is for improving the problem such that under a condition in which the reactive gas flows at a constant rate, the plasma also flows together, which prevents the plasma from being evenly produced in the reaction container 40.

In this example, the etching gas $NF_3$ is supplied inside the reaction container under the same conditions as in Example 1: the temperature of the furnace being 700° C., the pressure in the reaction container being 0.5 Torr and the flow rate being 700 SCCM. Ar or He as a rare gas may be supplied in addition to $NF_3$. In this example, the injector 47 is not used for supplying the gas. Nor are the wafers 54 rotated by the rotary shaft 45.

In Example 2, a predetermined amount of the etching gas is supplied inside the reaction container 40. Then, air outlet valve is closed and supplying the gas is stopped, thereby stopping the flow of the gas. A pressure valve is also closed to set the pressure in the reaction container 40 constant. Under the condition, a high frequency signal of 500 kHz and 200 W (output power) is supplied between the electrode pair 50 and 51 for a given period of time. As a result, the etching gas $NF_3$ is transformed into plasma. Then, the $SiO_2$ film is hardly etched as compared with its film thickness, as per Example 1. Further, the natural oxidization originated $SiO_2$ film as thin as 20 to 30 Å can be almost completely removed. If the amount of the gas is insufficient to completely remove the $SiO_2$ film in a single etching, the above steps have only to be repeated several times as needed to obtain the satisfactory result.

In Example 2, since the gas in the reaction container 40 does not flow and the pressure inside is uniform, the gas density anywhere in the reaction container 40 becomes nearly uniform. That is, the gas density is not rendered non-uniform by the flow of the gas.

In this example too, the etching is highly uniform to be within ±10%.

In this example, like in Example 1, a high frequency signal is applied between the electrodes 50 and 51 in burst form in a period of 0.1 to 0.5 sec, so that the unevenness of plasma resulting from the unevenness of an electric field generated in the reaction container can be reduced.

It should be also noted that the etching gas is not restricted to $NF_3$, but may be $CF_4+O_2$ or other type as well.

Second Step

After the etching gas used in the first step is all discharged using a vacuum pump, a gas for forming a film, $SiH_4$ in this example, is supplied inside the reaction container from the gas inlet 46 at a flow rate controlled to be a predetermined level. At this time, the pressure in the reaction container 40 is controlled to be a predetermined level.

In this manner, a polysilicon wiring film with a predetermined thickness is formed on the surface of each wafer 52 by a thermal CVD process.

In the second step also, the process gas is uniformly injected onto many wafers 52 disposed on the boat 43 by the injector 47, so that a film can uniformly formed on each wafer. The film can be formed with a uniform thickness o each wafer 52 by rotating the boat 43 around the rotary shaft 45.

After the natural oxidization film is removed from each wafer 52 obtained by the first and second steps, the wafer is soon subjected to a step of forming a wiring film of polysilicon or the like, in vacuum without being exposed to the air. As a result, no natural oxidization film exists at the contact portion between the wiring film and the base film, so that the resistance at the contact portion can be made smaller than the one required for the prior art. In addition, it is possible to provide better adhesiveness between the wiring film and base film.

Although the foregoing description of this embodiment has been given with reference to a case where this invention is applied to a process of forming a polysilicon film, this invention is also effective in a process of forming a silicon nitride ($SiN_4$) film, a tungsten (W) film or an $SiO_2$ film. A natural oxidization film has many pinholes and has an uneven thickness. As compared with the $SiO_2$ film obtained by a CVD process, therefore, the film formed in that case has a very poor characteristic as an insulating film. According to this invention, a good capacitor can be provide by removing a natural oxidization originated film on polysilicon prior to forming of an $SiN_4$ film on the polysilicon.

In the thermal CVD device shown in FIG. 1, only one pair of electrodes are provide. It is however possible to provide plural pairs of electrodes. In this case, two pairs of electrodes 51A and 51B, and 52A and 52B may be so arranged as shown in FIG. 5 that the electrodes of each pair are separated 180 degrees from each other, and 90 degrees from the adjacent electrodes of the other pair. High frequency signals RF1 and RF2 having a phase difference of 90 degrees are respectively supplied to the two pairs of electrodes, 52A and 52B, and 51A and 51B, respectively. As a result, electric fields E1 and E2 crossing at the right angles are generated in the reaction container, thus generating a rotating electric field. This rotating electric field can prevent the electric field distribution in the circumferential direction of the reaction container from being non-uniform.

Varying the frequencies of the high frequency signals RF1 and RF2 can also prevent such a non-uniform electric field distribution.

Figure 6A:
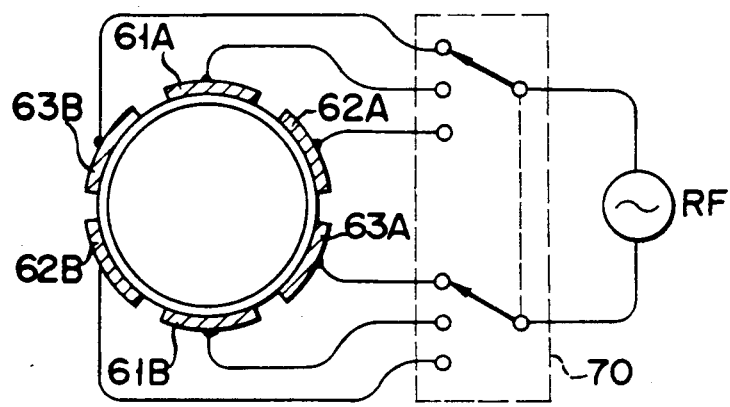
Figure 6B:
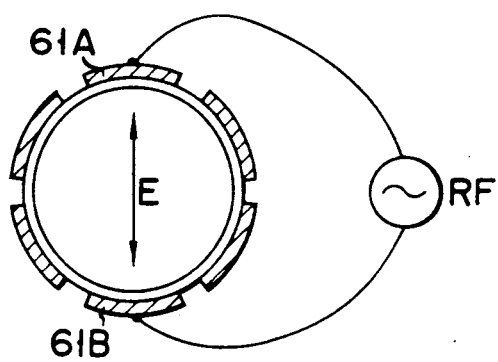
Figure 6C:
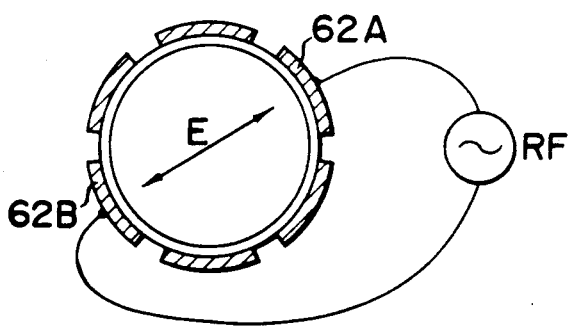
Figure 6D:
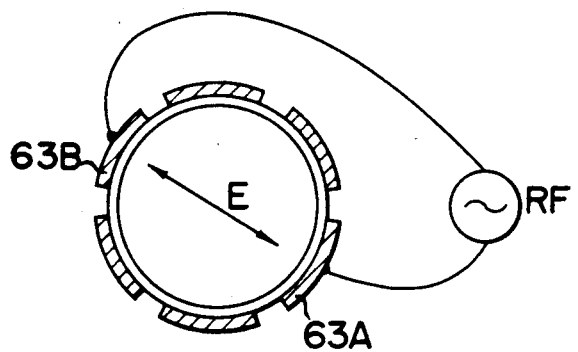

Alternately, three pairs of electrodes 61A and 61B, 62A and 62B, and 63A and 63B, may be arranged around the reaction container 40 in such a way that the electrodes of each pair are separated 180 degrees from each other and 60 degrees from the adjoining electrodes of the remaining pairs, as shown in FIG. 6A. A high frequency signal RF is supplied to these three pairs of electrodes while sequentially switching these electrode pairs at a given cycle by a switch 70. When the high frequency signal RF is applied to the first electrode pair 61A and 61B, therefore, an electric field E is generated vertically as shown in FIG. 6B. When the high frequency signal RF is applied to the second electrode pair 62A and 62B, the electric field E is generated with an inclination of 60 degrees to the vertical direction as shown in FIG. 6C. When the high frequency signal RF is applied to the third electrode pair 63A and 63B, the electric field E is generated with an inclination of 120 degrees to the vertical direction as shown in FIG. 6D. Accordingly, a rotating electric field is generated in the reaction container so that a non-uniform distribution of the electric field in the circumferential direction of the reaction container can be prevented.

Figure 7:
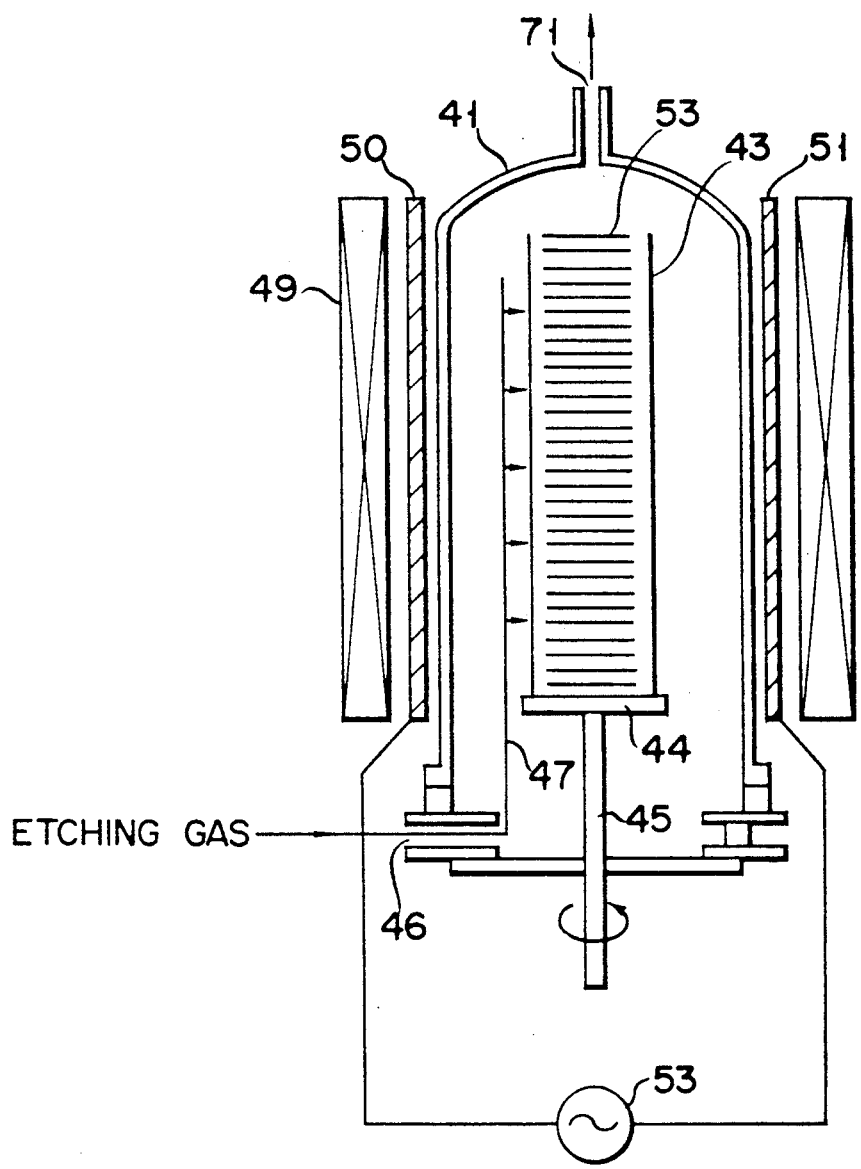
FIG. 7 is a diagram of another embodiment of the device shown in FIG. 1.

Although the foregoing description of the above embodiment has been given with reference to a film forming apparatus having the cylindrical inner quartz tube 42, this invention is not restricted to this particular type of film forming apparatus but may be applied to any film forming apparatus. For instance, this invention may be applied to a batch type CVD device having no inner quartz tube as shown in FIG. 7.

Since the structure of this device is well known to those skilled in the related art, its detailed description will be omitted, with the same reference numerals used in FIG. 1 being given to denote corresponding or identical elements. In this embodiment, an air outlet 71 is provided at the top of the outer quartz tube 41; the location of the air outlet is not restricted to this particular position though.

With the use of a reaction device having no inner cylindrical tube, plasma with higher intensity than the one generated by the device shown in FIG. 1 can be produced.

Of course, as no inner tube is provided, the discharging space can be widened accordingly, and the spatial uniformity of the plasma intensity can be improved. So is the uniformity of etching of a target object such as a wafer.

According to this invention, a film formed by natural oxidization on the base conductive film on each wafer is subjected to plasma etching by the facing electrodes provided outside the reaction container in the first step. This can eliminate the wet cleaning which is required by the prior art.

In addition, after the natural oxidization film is removed in the first step, a film can be formed on the wafer continuously in vacuum in the second step without the wafer being exposed to the air. Therefore, this invention can completely prevent formation of a natural oxidization film which is inevitably formed by the prior art when the wafer is loaded in the reaction container of the film forming device even such a natural oxidization film is removed by wet cleaning.

The wafer subjected to a film forming process by the present method in the above-described manner has no natural oxidization film existing at the contact portion between the wiring film and base film, so that the resistance at the contact portion can be made smaller than the one required for the prior art. In addition, it is possible to provide better adhesiveness between the wiring film and base film. This can ensure forming of a good film on a semiconductor wafer with a higher integration density and a smaller contact area between the wiring film and base film.

Figure 8:
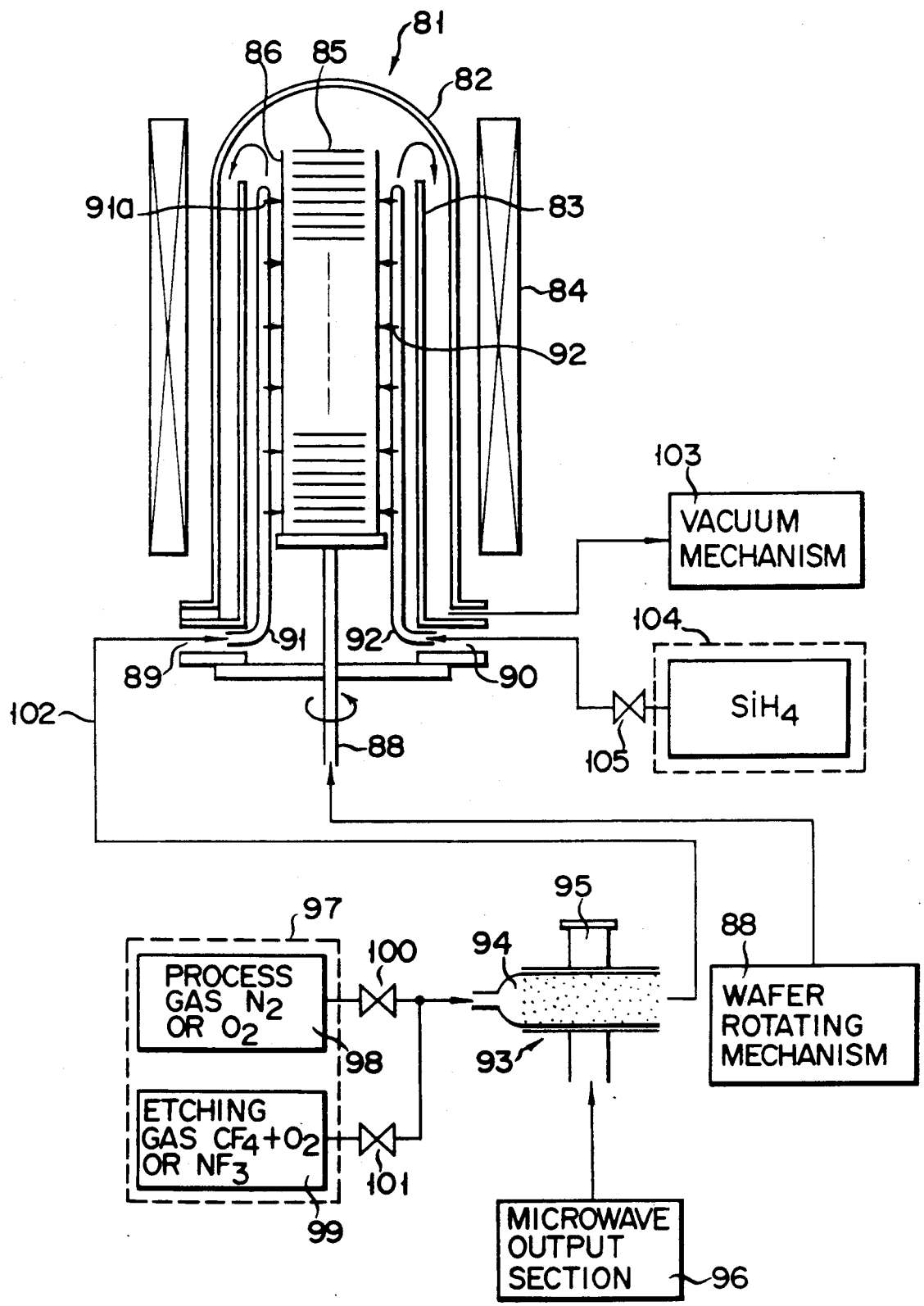
FIG. 8 is a diagram illustrating the structure of another embodiment of this invention as applied to a device for forming an $Si_3N_4$ film.

Another embodiment of this invention will now be described below. FIG. 8 is a diagram for explaining a vertical type heat treatment device to which this invention is applied. Referring to this diagram, 81 reaction container. The reaction container 81, provided almost vertically, has a double tube structure comprising an outer cylindrical tube 82 of quartz, for example, and a columnar inner cylindrical tube of quartz, for example, which is disposed concentric in the outer cylindrical tube with some gap therebetween. A heater mechanism 84 and a heat shielding section (not shown) are so provided as to surround the reaction container 81.

A wafer boat 86 having many wafers 85 as target objects stacked thereon is accommodated in the inner cylindrical tube 83. The wafer boat 86 is placed on a boat support 88 which is provided rotatable by a wafer rotating mechanism 87.

At the side wall of the reaction container 81 at the bottom portion thereof are a process gas inlet 89 and a reactive gas inlet 90. The first inlet 89 is for introducing a process gas $N_2$ in the reaction container 81 to form an $Si_3N_4$ film and introducing an $O_2$ gas to form an $SiO_2$ film, or introducing an etching gas such as $CF_4+NF_3$ in the reaction container 81 for performing an etching process. The latter inlet 90 is for introducing a reactive gas such as $SiH_4$ in the reaction container.

L-shaped gas outlet tubes 91 and 92 have their gas outlet portions provided in the space between the inner cylindrical tube 83 and the a column of wafers 85, and have their distal end portions respectively inserted in the process gas inlet 89 and the reactive gas inlet 90. Gas discharge holes 91a and 92a are bored at given pitches in the gas outlet portions of the gas outlet tubes 91 and 92. In a vertical furnace, the density of the reactive gas at the upper portion of the furnace tends to be lower than that at the lower portion. This is the reason why the reaction gas is used for etching and film forming. According to this embodiment, therefore, the pitches of the gas discharge holes 91a and 92a are so set that they gradually become narrower upward along the gas outlet tubes 91 and 92. This can provide a uniform gas density in the reaction container 81.

A plasma producing mechanism 93 for transforming a process gas into plasma is provided outside the reaction container 81.

This plasma producing mechanism 93 mainly comprises a plasma producing container 94, a microwave guide 95 for guiding a microwave for producing plasma, and a microwave output section 96 for supplying a microwave, e.g., a microwave pulse of 2.45 GHz and a pulse width of 20 mS.

A process gas source 97 includes an $O_2$ or $N_2$ gas source 98 for forming a film and an etching gas source 99 for supplying an etching gas such as $CF_4+O_2$ or $NF_3$. These gas sources 98 and 99 are connected respectively through switching valves 100 and 101 to the plasma producing container 94.

A process gas transformed into plasma by the plasma producing mechanism 93 is guided through a plasma gas transporting tube 102 to the process gas outlet tube 91 and is then discharged from the gas discharge holes 91a.

With the use of the film forming device with the above structure, various processes can be executed, which will be described referring to the accompanying drawings.

With reference to the operational flowchart of FIG. 9, a description will be given first of the first example of such processes, which is to form an $Si_3N_4$ passivation film on a semiconductor wafer.

The boat support 88 is lowered by an elevator mechanism (not shown). The wafer boat 86 is disposed on the support 88. Then, the boat support 88 is moved upward to be accommodated again in the reaction container (wafer loading) (step 111).

Then, the reaction container 81 is deaired through the air outlet 90 provided in the side wall at the bottom portion thereof by a vacuum mechanism 103, so that the container 81 has a predetermined vacuum level of 0.001

Torr therein. The semiconductor wafers 85 are heated up to a predetermined temperature, such as 300° C. by the heater mechanism 84 (step 112).

Then, the switching valve 101 of the etching gas source 99 is closed. The switching valve 100 for the film forming process gas source 98 is open to introduce a process gas ($N_2$ gas in this embodiment) in the plasma producing container 94. Then, a microwave of a power of 600 W and a frequency of 2.45 GHz, for example, is supplied to the plasma producing container 94 to transform the $N_2$ gas into plasma.

The plasma $N_2$ gas is then guided through the plasma transporting tube 102 to the process gas outlet tube 91, and a predetermined amount of this gas which corresponds to, for example, the $N_2$ divided pressure of 1.0 Torr, is injected in the reaction container 81 from the gas discharge holes 91a. At the same time as this operation of injecting the process gas, the value for the reactive gas source 104 is open so that a predetermined amount of the reactive gas ($N_2$ based raw gas containing 12% of $SiH_4$ in this embodiment) which corresponds to, for example, the divided pressure of 0.2 Torr, is injected from the reactive gas discharge tube 92 (step 115).

An $Si_3N_4$ film is formed on each semiconductor wafer 85 while rotating the wafer boat 86 at a predetermined velocity, e.g., 6 rpm, by the wafer rotating mechanism 87 (step 116). Then, the wafer boat 86 is carried out the reaction container 81 (wafer unloading) (step 117) while purging the inside of the reaction container 81 with a purge gas, such as $N_2$ gas (step 116). The film forming step (step 120) comprises the steps of the wafer loading (step 111), deairing and raising the temperature (step 112), transforming of the film forming process gas into plasma (step 113), introducing the film forming process gas and reactive gas (step 114), forming a film (step 115), purging (step 116) and wafer unloading (step 117), executed in the named order.

According to this film forming method, the process gas is introduced in the reaction container 81 for some treatment after being transformed into plasma outside the reaction container. Accordingly, the plasma producing source can be separated from the target objects, thus preventing the target objects (wafers) from being damaged by plasma particles. As many semiconductor wafers are accommodated in the reaction container 81 and are heated by the heater mechanism 84 the reaction container 81, these wafers can be evenly heated at a time, thus ensuring a uniform plasma process.

Further, according to this embodiment, the gas discharge holes 91a and 92a are bored in the gas outlet tubes 91 and 92 in such a way that their pitches become narrower upward along the length of the reaction container 81. The wafer boat 86 is rotated during a treatment. Accordingly, the density of the process gas or reactive gas contacting the individual wafers 85 become uniform, further ensuring a uniform process.

According to the film forming device according to the above embodiment, therefore, a uniform process of many target objects can be realized without damaging the target objects by the plasma.

Figure 10:
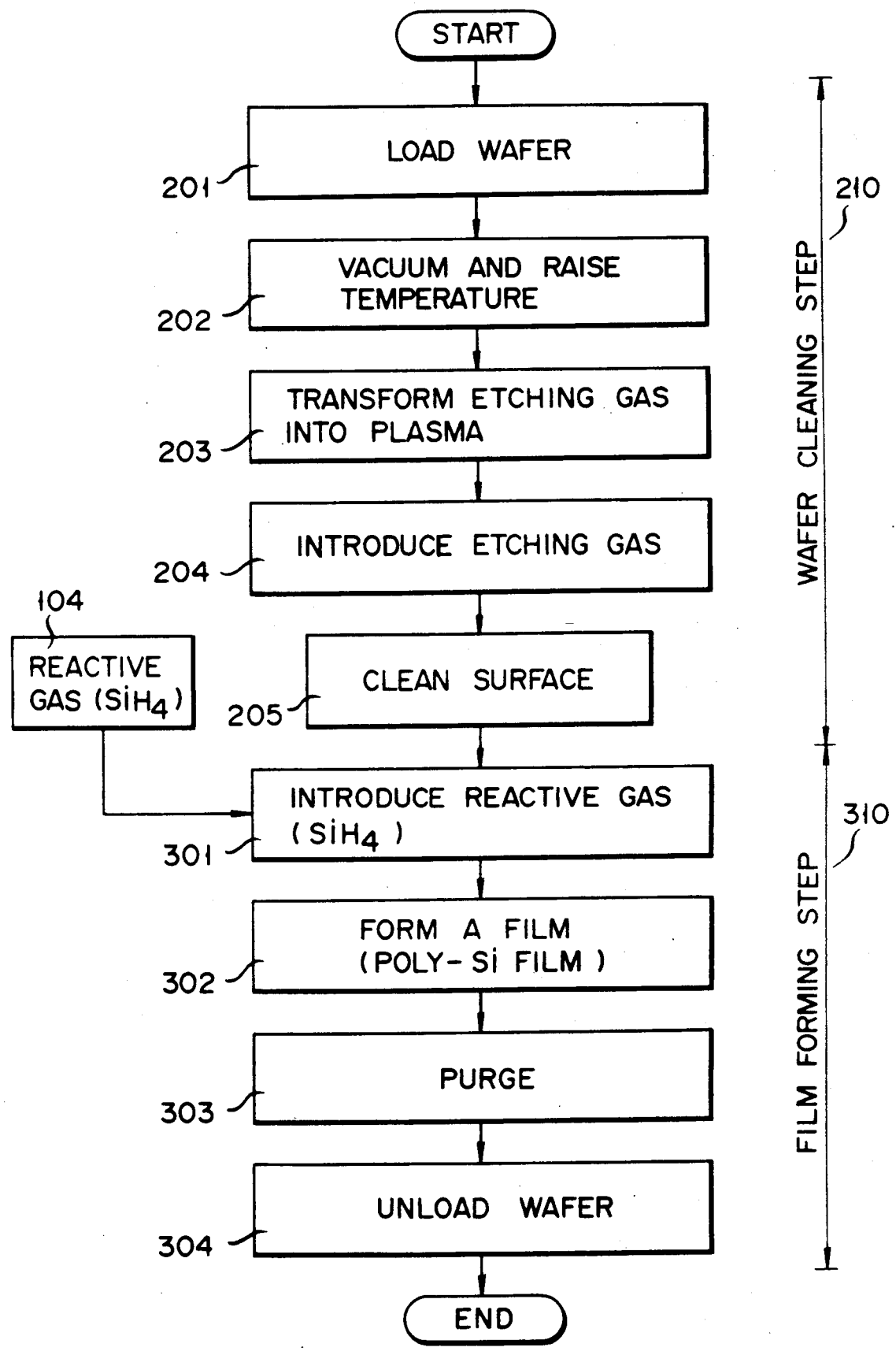
FIG. 10 is a diagram for explaining how to sequentially executing the wafer cleaning step and the Poly-Si film forming step as illustrated in FIG. 9.

With reference to the operational flowchart of FIG. 10, a description will be given of the second example of the processes executed using the present semiconductor fabricating device, which is to form a Poly-Si film on a semiconductor wafer after cleaning the surface of the wafer.

The boat support 88 is lowered by an elevator mechanism (not shown). The wafer boat 86 is disposed on the support 88. Then, the boat support 88 is moved upward to be accommodated again in the reaction container (wafer loading) (step 201).

Then, the reaction container 81 is deaired through the air outlet 90 provided in the side wall at the bottom portion thereof by a vacuum mechanism 103, so that the container 81 has a predetermined vacuum level of 0.001 Torr therein. The semiconductor wafers 85 are heated up to a predetermined temperature, such as 630° C. by the heater mechanism 84 (step 202). Then, the switching valve 100 of the film forming process gas source 98 is closed. The switching valve 101 for the etching gas source 99 (the etching gas being $CF_4+O_2$ or $NF_3$ in this embodiment) is open to introduce a $CF_4+O_2$ or $NF_3$ gas in the plasma producing container 94. Then, a microwave of a power of 600 W and a frequency of 2.45 GHz, for example, is supplied to the plasma producing container 94 to transform the $CF_4+O_2$ or $NF_3$ gas into plasma (step 203).

The plasma $CF_4+O_2$ or $NF_3$ gas is then guided through the plasma transporting tube 102 to the process gas outlet tube 91, and is injected in the reaction container 81 from the gas discharge holes 91a (step 204). In this manner, a cleaning process for removing an impurity film, such as a natural oxidization film, formed on each wafer 85 (step 205).

The wafer cleaning step (step 210) comprises the steps of the wafer loading (step 201), deairing and raising the temperature (step 202), transforming of the etching gas into plasma (step 203), introducing the etching gas (step 204), and surface cleaning (step 205), executed in the named order.

After completing the wafer cleaning step, the switching valve 101 of the etching gas source 99. Then, the valve 105 of the reactive gas source 104 is open to introduce the reactive gas (raw gas of $SiH_4$ in this embodiment) through the gas outlet tube 92 into the reaction container 81 (step 301). A Poly-Si film is formed (step 302) while maintaining the temperature inside the reaction container 81 at, for example, 630° C., as per the wafer cleaning step (step 210).

Then, the wafer boat 86 is carried out the reaction container 81 (wafer unloading) (step 304) while purging the inside of the reaction container 81 with a purge gas, e.g., $N_2$ (step 303). The step of forming the Poly-Si film (step 310) comprises the steps of introducing the reactive gas (step 301), forming the Poly-Si film (step 302), purging (step 303), and wafer unloading (step 304), executed in the named order.

According to this film forming method, the wafer cleaning step (210) and the Poly-Si film forming step (310) can be continuously executed without exposing the wafers to the air, thus improving the productivity. Since both of the wafer cleaning step (210) and the Poly-Si film forming step (310) can be subjected to a treatment at the same temperature, e.g., 630° C., always operating the heater mechanism 84 can eliminate the temperature raising and reducing step. This can shorten the required working time.

The film forming step after the wafer cleaning step may be other than the aforementioned Poly-Si film forming step; for example, it may be a tungsten film forming step, in which case the atmosphere in the reaction container should be altered to the proper one for a tungsten film.

Figure 11:
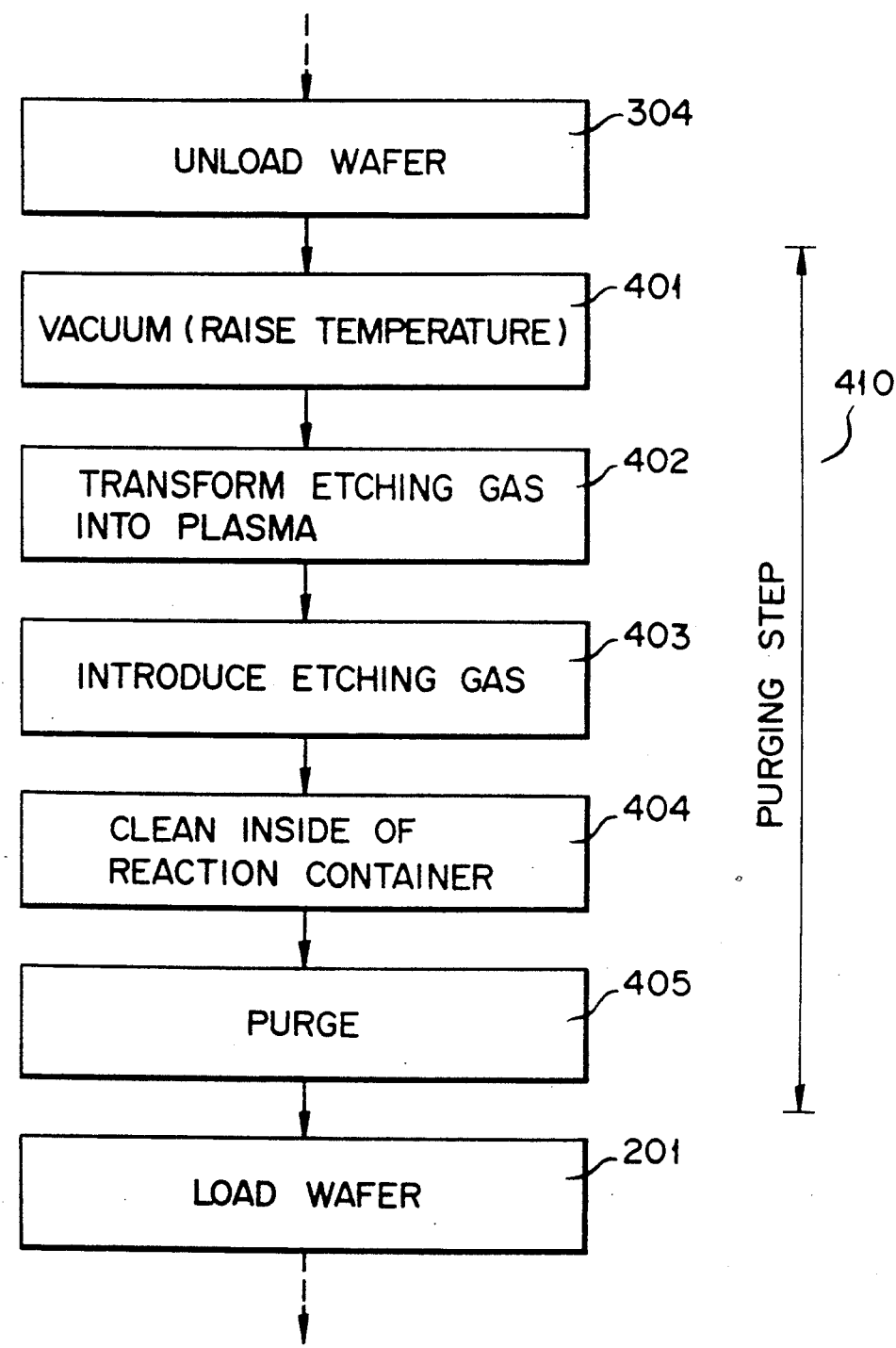
FIG. 11 is a diagram for explaining the method of cleaning the interior of a reaction container as shown in FIG. 9.

With reference to the operational flowchart of FIG. 11, a description will be given of the third example of the processes executed using the present semiconductor fabricating device, which is to remove a reaction produced film such as a Poly-Si film adhered inside the reaction container.

After the wafers are unloaded (step 304) upon completion of the film (e.g., Poly-Si film) forming, the side wall of the reaction container 81 at the bottom portion is subjected to cleaning (step 404) to remove the Poly-Si film or the like.

Then, the inside of the reaction container 81 is purged with a purge gas, such as $N_2$ (step 405), then the semiconductor wafers for the next process are loaded (step 201).

The cleaning step (step 410) comprises the steps of the wafer unloading (step 304), deairing and raising the temperature (step 4010, transforming of the etching gas into plasma (step 402), introducing the etching gas (step 403), and purging the interior of the reaction container (step 404), executed in the named order.

According to this film forming method, the Poly-Si film forming step (310) and the cleaning step (410) can be continuously executed. Both of the Poly-Si film forming step (310) and the cleaning step (410) can be subjected to a treatment at the same temperature, e.g., 630° C. Therefore, always operating the heater mechanism 84 can eliminate the temperature raising and reducing step. This can shorten the required working time.

It should be noted that the cleaning step (410) need not be executed for each film forming process, but may be executed only when the inside of the reaction container is stained by a reaction product.

According to the film forming device and film forming method, as described above, the plasma producing mechanism 93 is provided outside the reaction container 81. Also, the reaction container 81 having many semiconductor wafers 85 is heated by the heater mechanism 84 provided outside the reaction container. Therefore, the wafers can be prevented from being damaged by the plasma particles, and they can be heated uniformly at a time, thus ensuring a uniform plasma process.

Although the foregoing description of this embodiment has been given with reference to a case of using semiconductor wafers as target objects, this invention can also apply to other cases; for instance, the case of processing other semiconductor devices such as LCD substrates.

The present invention can apply not only to a plasma process device having a vertical type reaction container but also to the one having a horizontal type reaction container.

Figure 12:
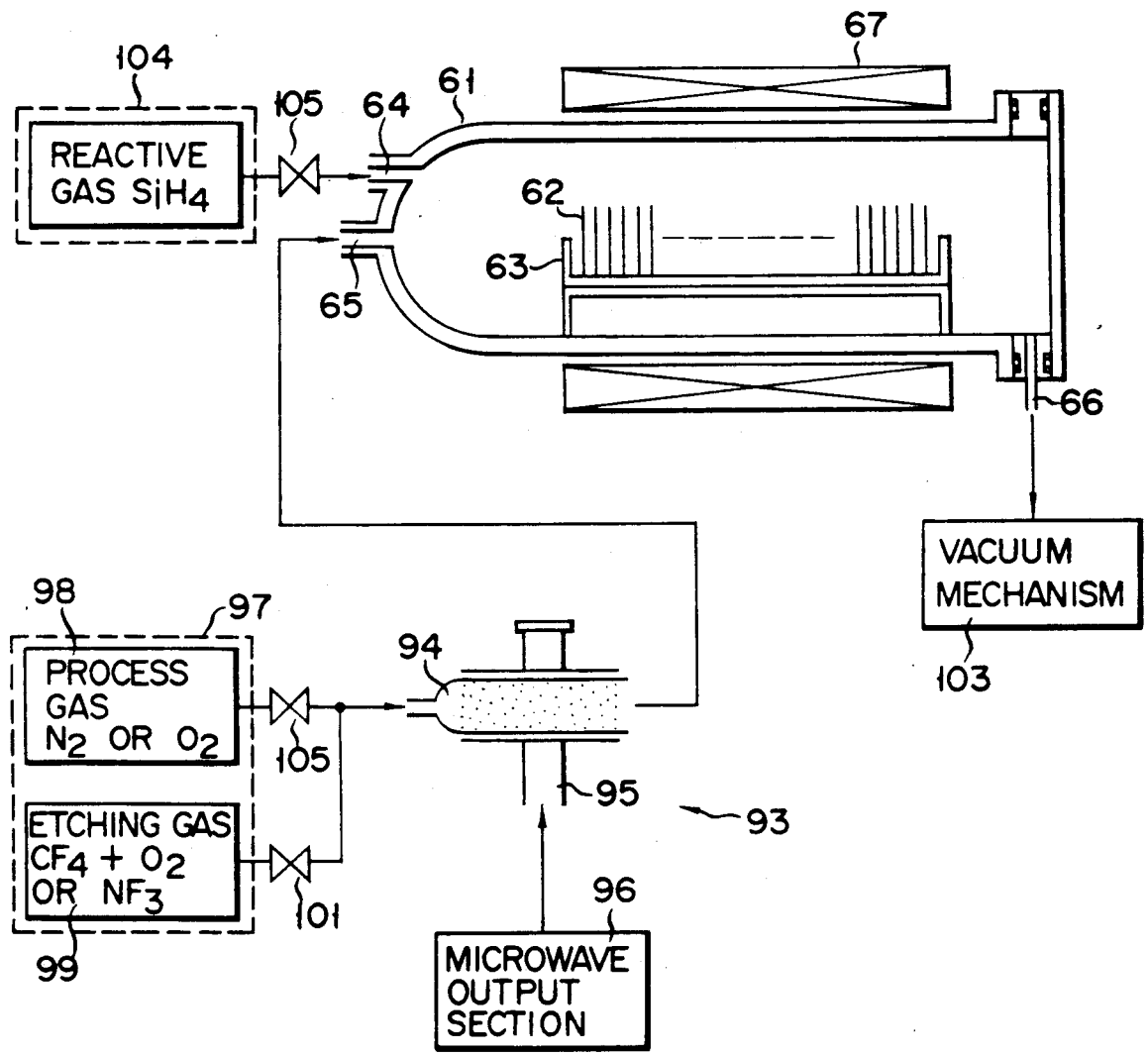
FIG. 12 is a diagram illustrating the structure of a different embodiment of this invention.

FIG. 12 illustrates another embodiment in which the invention is applied to a plasma process device having a horizontal type reaction container. The same numbers as used in FIG. 8 are also used to denote corresponding or identical elements, thus avoiding a redundant description.

A cylindrical reaction container 61 made of a heat shielding material such as quartz is provided horizontally. In this reaction container 61, a wafer boat 63 having many target objects, such as semiconductor wafers, disposed therein is accommodated. A reactive gas inlet 64 and a process gas inlet 65 are provided at one end portion of the reaction container 61. An air outlet 66 connected to a vacuum mechanism 103 is provided at the other end portion. A heater mechanism 67 and a heat shielding member (not shown) are provided around the reaction container 61.

The plasma process in the horizontal furnace with the above structure, for example, the $Si_3N_4$ film forming process, is executed in the same manner as is done in the first embodiment. That is, this film forming process is executed by introducing the film forming process gas such as $N_2$ gas 98 transformed into plasma by the plasma producing mechanism 93 and the reactive gas such as $SiH_4$ gas 104 in the reaction container 61.

In forming a Poly-Si film, the etching gas process gas such as $CF_4+O_2$ or $NF_3$ gas 99 is transformed into plasma by the plasma producing mechanism 93, and the surfaces of the wafers 62 are cleaned using this etching gas. Then, the reactive gas such as $SiH_4$ gas 104 is introduced to form the Poly-Si film.

Further, after unloading the wafers, the inside of the reaction container 61 is cleaned with the etching gas process gas such as the $CF_4+O_2$ or $NF_3$ gas transformed into plasma.

According to the present film forming device and film forming method, as described above, processes such as the plasma CVD, plasma etching and cleaning of the interior of the reaction container, can be continuously executed by the processing devices having a similar structure. Further, it is possible to prevent the semiconductor wafers from being damaged by the plasma particles, and to uniformly heat many wafers at a time, thus ensuring a more uniform process. In other words, the present device and present method can improve the yield, shorten the work time, and provide a uniform process, thus contributing significantly to improvement of the productivity.

What is claimed is:

1. A film forming method comprising the steps of:
   placing a plurality of objects to be processed in a reaction container;
   supplying an etching gas in said reaction container;
   making said etching gas into a plasma;
   removing a natural oxidization originated film on said objects to be processed under a heating condition by said plasma;
   exhausting said etching gas after stopping supply of said etching gas so as to stop making of said plasma; and
   supplying a film forming gas in said reaction container without rendering said reaction container open to air so as to form a film on said objects.

2. A film forming device for performing a predetermined treatment on a plurality of objects to be processed accommodated in a reaction container using a process gas and a reactive gas, said device comprising:
   a plasma mechanism, provided outside said reaction container, for making said process gas into a plasma; and
   a plasma transporting tube for guiding process-gas plasma provided by said plasma mechanism inside said reaction container in a direction parallel to respective surfaces of said objects on which a film is to be formed.

3. A film forming method comprising the steps of:
   making an etching gas into a plasma by means of a plasma mechanism provided outside a reaction chamber;
   introducing said etching gas made into plasma into a reaction container and removing a surface layer of each of a plurality of objects to be processed by said etching gas made into plasma; and introducing a reactive gas into said reaction container to form a film on a cleaned surface of said objects to be processed.

4. A film forming method according to claim 3, wherein the film formed on each of said objects to be processed is formed by a process gas made into a plasma by said plasma mechanism and said respective gas.

5. A film forming method according to claim 4, wherein after said etching gas is made into a plasma by said plasma mechanism, said plurality of objects to be processed are etched using said plasma of said etching gas.

6. A film forming method according to claim 5, wherein an interior of said reaction container is cleaned by said plasma of said etching gas.

* * * * *